(12) United States Patent
Chen et al.

(10) Patent No.: US 9,935,136 B2
(45) Date of Patent: Apr. 3, 2018

(54) MANUFACTURING METHOD OF DISPLAY WITH LIGHTING DEVICES

(71) Applicant: Innolux Corporation, Chu-Nan, Miao-Li County (TW)

(72) Inventors: Bo-Feng Chen, Chu-Nan (TW); Tsau-Hua Hsieh, Chu-Nan (TW); Tung-Kai Liu, Chu-Nan (TW)

(73) Assignee: INNOLUX CORPORATION, Chu-nan, Miao-Li County (TW)

(*) Notice: Subject to any disclaimer, the term of this patent is extended or adjusted under 35 U.S.C. 154(b) by 0 days.

(21) Appl. No.: 15/361,272

(22) Filed: Nov. 25, 2016

(65) Prior Publication Data

US 2017/0154919 A1 Jun. 1, 2017

Related U.S. Application Data

(60) Provisional application No. 62/260,359, filed on Nov. 27, 2015.

(30) Foreign Application Priority Data

Jul. 5, 2016 (CN) .......................... 2016 1 0521178

(51) Int. Cl.
*H01L 27/12* (2006.01)
*H01L 21/683* (2006.01)
*H01L 23/00* (2006.01)
*H01L 25/075* (2006.01)

(52) U.S. Cl.
CPC ...... *H01L 27/1259* (2013.01); *H01L 21/6835* (2013.01); *H01L 24/05* (2013.01); *H01L 25/0753* (2013.01); *H01L 2221/68309* (2013.01); *H01L 2221/68313* (2013.01); *H01L 2221/68354* (2013.01); *H01L 2221/68368* (2013.01)

(58) Field of Classification Search
CPC .. H01L 27/1259; H01L 21/6835; H01L 24/05
See application file for complete search history.

(56) References Cited

U.S. PATENT DOCUMENTS

2013/0168708 A1* 7/2013 Shibata ............... H01L 25/0753
257/88

* cited by examiner

*Primary Examiner* — Errol Fernandes
(74) *Attorney, Agent, or Firm* — Rabin & Berdo, P.C.

(57) ABSTRACT

A manufacturing method of display with lighting devices is disclosed, including providing a tank containing a liquid; disposing a carrying plate with several recessed regions in the tank, and the carrying plate being immersed in the liquid; dropping several lighting devices into the liquid, wherein each of the lighting devices includes two conductive pads, and one of the two conductive pads includes a magnetic material; applying a magnetic field for the lighting devices and the lighting devices will dispose within the recessed regions of the carrying plate; removing the carrying plate with the lighting devices out of the tank, and assembling the lighting devices to an array substrate.

13 Claims, 10 Drawing Sheets

MANUFACTURING METHOD OF DISPLAY WITH LIGHTING DEVICES

This application claims the benefit of a prior-filed provisional application Ser. No. 62/260,359, filed Nov. 27, 2015, and the benefit of People's Republic of China application Serial No. 201610521178.X, filed Jul. 5, 2016, the subject matters of which are incorporated herein by references.

BACKGROUND

Technical Field

The disclosure relates in general to a manufacturing method of display with lighting devices, and more particularly to an arrangement method of lighting devices of a display.

Description of the Related Art

Electronic products with display panel, such as smart phones, tablets, notebooks, monitors, and TVs, have become indispensable necessities to modern people no matter in their work, study or entertainment. With a flourishing development of the portable electronic products, the consumers have higher expects on the functions, the specifications and the prices of the products. The development of next-generation display focuses on the energy saving and environment-friendly techniques.

Different displaying techniques have been well-developed. For example, liquid crystal display (LCD) has several advantages of lightweight, compactness, portability and low price, which has replaced the CRT monitors and becomes one of the most commonly-used displays in the electronic products. Besides LCD displaying technique, the displaying techniques also include the organic light-emitting diode (OLED) displaying technique and the micro-LED displaying technique. In the OLED displaying technique, the organic material thin film (ex: an emissive electroluminescent layer) and the glass substrate are adopted. When an electric current passes through the emissive electroluminescent layer, the emissive electroluminescent layer emits light in response to the electric current; thus, no backlight is required in the OLED display. Compared to the LCD, the OLED display without a backlight saves more energy, and is lighter and thinner. However, the life span of an OLED display is less, compared to LCD (ex: due to the short life span of the blue organic material). Also, making a large size OLED display is considerably more challenging than LCD. The micro-LED displaying technique drives an array of addressed micro-LEDs, and possesses several advantages such as power-saving, simple construction, small volume, thin outline package, high brightness, high reliability and high speed of response, etc. Moreover, the stability of materials and the life span of the micro-LED display are better than that of the OLED display. The micro-LED display would be more competitive than the OLED display in the future, wherein the micro-LEDs are mounted on the array substrate (known as "LED on array"). In the current manufacturing method, the micro-LEDs are formed and diced into several micro-LED chips (i.e. micro-lighting devices). The driving circuits and related traces are formed on the glass substrate to provide an array substrate (ex: TFT array substrate), and the micro-LED chips are then mounted on the array substrate. Afterwards, the electrical connection between the array substrate and an external controlling circuit is accomplished, followed by packaging process. The conventional method for disposing the micro-LEDs uses pick-and-place for assembly. However, there are hundreds of thousands sub-pixels or couple million sub-pixels of a display, the pick-and-place method is very time-consuming, which is definitely not suitable for massive production. Also, it is unlikely to apply the pick-and-place method for mounting the micro-LEDs on to a display with ultra-high resolution (ex: a display with 2K/4K resolution has 25 million sub-pixels).

SUMMARY

The disclosure is directed to a manufacturing method of display with lighting devices, and more particularly to an arrangement method of lighting devices of a display. According to the embodiment, at least one of the conductive pads of each lighting device includes a magnetic material. By applying an external magnetic field with magnetic force exerting on the lighting devices, a large number of the lighting devices can be arranged quickly and efficiently assembled to an array substrate of a display.

According to one aspect of the present disclosure, a manufacturing method of display with lighting devices is provided, comprising steps of providing a tank containing a liquid; disposing a carrying plate with several recessed regions in the tank, and the carrying plate being immersed in the liquid; dropping a plurality of lighting devices into the liquid, wherein each of the lighting devices includes at least two conductive pads, and at least one of the at least two conductive pads includes a magnetic material; applying a magnetic field for setting the lighting devices within the recessed regions of the carrying plate; and removing the carrying plate with the lighting devices out of the tank, and assembling the lighting devices to an array substrate.

According to another aspect of the present disclosure, a display with lighting devices is provided, comprising an array substrate, comprising a plurality of sub-pixel regions; and a plurality of lighting devices disposed on the array substrate, wherein at least one of the plurality of lighting devices is disposed correspondingly to each of the plurality of sub-pixel regions, and at least one of the plurality of lighting devices includes two conductive pads, and one of two conductive pads includes magnetic material.

BRIEF DESCRIPTION OF THE DRAWINGS

FIG. 3A-FIG. 3D illustrate an arrangement method of lighting devices of a display according to the first embodiment of the disclosure.

FIG. 6A-FIG. 6D illustrate an arrangement method of lighting devices of a display according to the third embodiment of the disclosure.

DETAILED DESCRIPTION

In the embodiments of the present disclosure, a manufacturing method of display with lighting devices is provided. More particularly, an arrangement method of lighting devices of a display is disclosed. According to the embodiment, at least one of the conductive pads of each lighting device includes a magnetic material. By applying an external magnetic field with magnetic force exerting on the lighting devices, a large number of the lighting devices can be arranged quickly and efficiently assembled to an array substrate of a display. When the method of the embodiment is applied in the application of a self-emission type of display, the lighting devices can be arranged in a short period, and subsequently disposed and assembled to the corresponding sub-pixels at a time. The embodied method applied for manufacturing a display with lighting devices does significantly shorten the manufacturing time, which has great economic value and is suitable for mass production. Accordingly, the conventional method for disposing the lighting devices (i.e. pick-and-place, which is time-consuming and not suitable for massive production) can be replaced by the embodied method applied for manufacturing a display with lighting devices.

The embodiments of the present disclosure can be applied to an array substrate of a display, and the switch elements can be (but not limited to) the thin film transistors (TFT). Examples of the applicable types of TFT include the back channel etch type TFT, the etch-stop type TFT, the top-gate type TFT, and the bottom-gate type TFT. The applicable types of lighting devices in the embodiment can be micro-LEDs (light emitting diodes), OLEDs, or other suitable self-emission components.

Figure 1A:
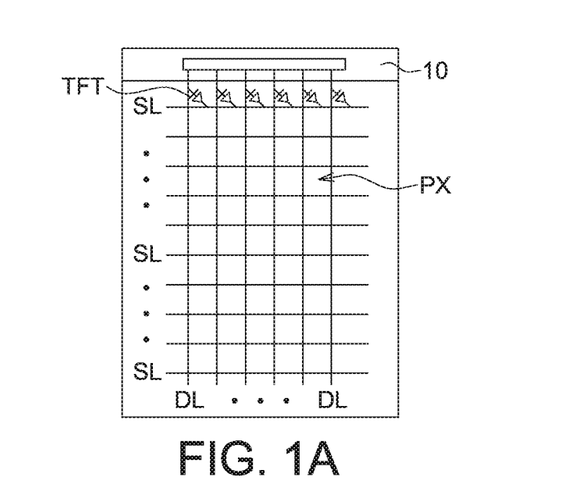
FIG. 1A is a simple top view of an array substrate of a display according to an application of the present disclosure.
Figure 1B:
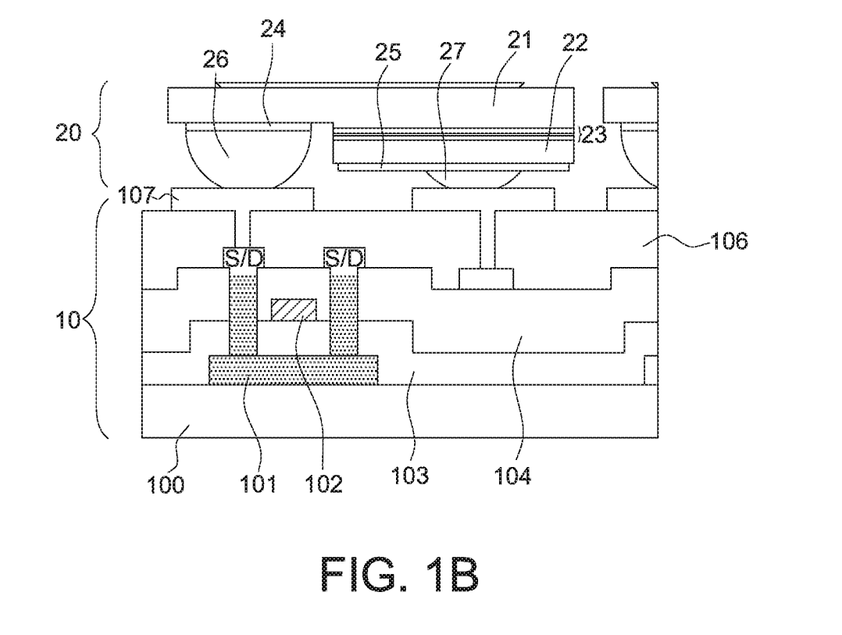
FIG. 1B is a cross-sectional view of a pixel region of a display according to an application of the present disclosure.

FIG. 1A is a simple top view of an array substrate of a display according to an application of the present disclosure. An array substrate 10 includes several data lines DL and several scan lines SL intersected with each other to define a plurality of pixel regions PX on an array. Each pixel region PX (such as a sub-pixel region) includes at least one switch element, such as a TFT, for independently controlling an affiliated pixel region PX. FIG. 1B is a cross-sectional view of a pixel region of a display according to an application of the present disclosure. In the illustration, one TFT of a sub-pixel region is correspondingly assembled to a lighting device. However, the disclosure is not limited thereto. The TFT of the array substrate 10 comprises the semiconductor layer 101 formed on the substrate 100, the gate insulating layer 103 formed on the semiconductor layer 101, the gate electrode 102, the interlayered dielectric (ILD) layer 104, the source and the drain (S/D), the protective layer 106 and the positive/negative connection pads 107.

The lighting devices 20 of the embodiment can be implemented by micro-LEDs. Take a GaN (gallium-nitride)-based LED (i.e. a blue light-emitting diode) for example. A GaN-based LED includes a N-GaN layer 21, a P-GaN layer 22, a multiple-quantum-well layer (MQW) 23, a N-conductive layer 24 formed on the N-GaN layer 21, a P-conductive layer 25 formed on the P-GaN layer 22, an N-bump 26 formed on the N-conductive layer 24 and a P-bump 27 formed on the P-conductive layer 25. Also, the N-bump 26 and the N-conductive layer 24 function as a N-electrode of the -lighting device 20, while the P-bump 27 and the P-conductive layer 25 function as a P-electrode of the lighting device 20. The conductive pads of the embodiment can be referred to the N-bump 26 and the P-bump 27. It is known that those elements as described above are provided for illustrating one type of applicable lighting device 20. Other light colors and/or configurations of the lighting devices are applicable, and the disclosure is not limited thereto. The display is accomplished by connecting the N-bump 26 and the P-bump 27 of the lighting device 20 to the positive and negative connection pads 107 of the array substrate 10 (through the thermal thermo-compression bonding/hot press).

Figure 2:
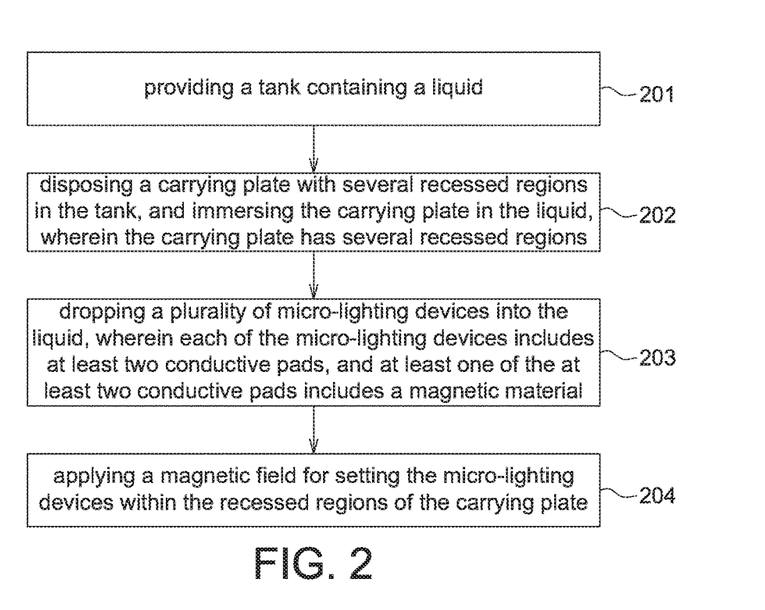
FIG. 2 is an arrangement method of lighting devices of a display according to one embodiment of the disclosure.

FIG. 2 is an arrangement method of lighting devices of a display according to one embodiment of the disclosure. The lighting devices can be arranged efficiently by adopting the method of FIG. 2. First, a a tank containing a liquid is provided (step 201). A carrying plate is disposed in the tank and immersed in the liquid, wherein the carrying plate has several recessed regions (step 202). The recessed regions can be positioned in accordance with the sub-pixel alignment of a display. For example, each of the recessed regions is positioned correspondingly to position of one sub-pixel. Alternatively, two or more recessed regions can be positioned correspondingly to position of one sub-pixel. Several lighting devices are dropped into the liquid, wherein each of the lighting devices includes at least two conductive pads, and at least one of the conductive pads includes a magnetic material (step 203). A magnetic field is applied for setting the lighting devices within the recessed regions of the carrying plate (step 204). Afterwards, the carrying plate with the lighting devices is removed out of the tank, and the lighting devices are assembled to an array substrate, thereby achieving assembly and electrical connection between the lighting devices and the array substrate of the display.

Several embodiments are provided hereinafter with reference to the accompanying drawings for describing the related procedures and configurations. Also, a lighting device having two conductive pads such as a N-type conductive pad 26 and a P-type conductive pad 27 is depicted in the drawings for clearly illustrating the disclosure. The conductive pad can be made of a single material layer or a multi-layer comprising metal or alloy layers, depending on the requirements of LED bonding and reliability in practical application. Also, an anisotropic conductive film (ACF) can be coated on the conductive pads for improving electrical connection between the lighting devices and the array substrate. In the following embodiments, a single material layer is exemplified as the conductive pad for clear demonstration; however, the disclosure is not limited thereto.

Related structural details, such as layers and spatial arrangement, are further described in the embodiments. However, the present disclosure is not limited thereto. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense. Moreover, the identical and/or similar elements of the embodiments are designated with the same and/or similar reference numerals.

Moreover, use of ordinal terms such as "first", "second", etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

First Embodiment

Figure 3A:
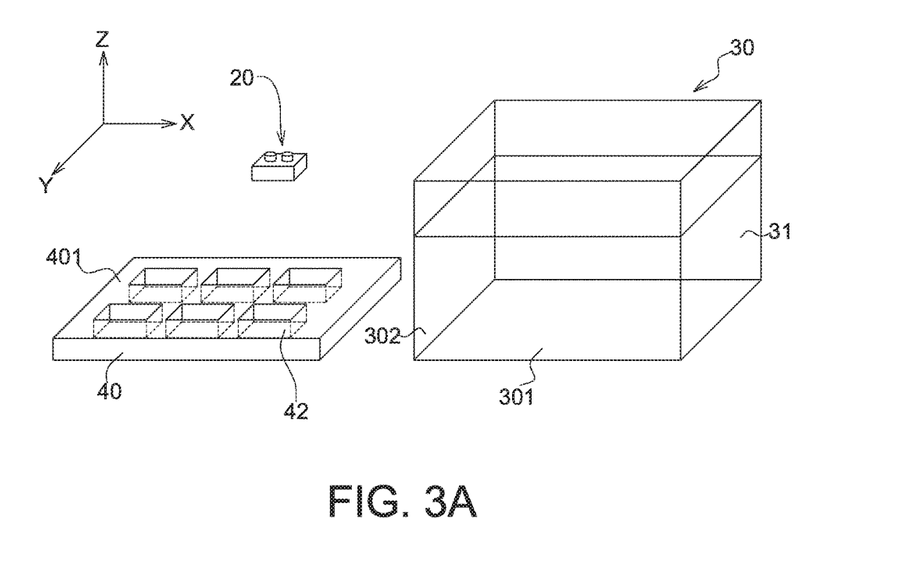

FIG. 3A-FIG. 3D illustrate an arrangement method of lighting devices of a display according to the first embodiment of the disclosure. First, a a tank 30 containing a liquid 31 and a carrying plate 40 having several recessed regions 42 are provided, as shown in FIG. 3A. Also, several lighting devices 20 such as micro-LED chips are provided. The recessed regions 42 of the carrying plate 40 can be positioned in accordance with the sub-pixel alignment of the display. For example, if the driving devices (ex: TFT) of the display in application are arranged as an array as shown in FIG. 1A, the recessed regions 42 can be arranged in an array and positioned correspondingly to the positions of the TFTs. Several portions of the top surface 401 of the carrying plate 40 can be recessed to form the recessed regions 42. In some embodiments, one recessed region 42 is positioned correspondingly to the position of one sub-pixel of the display. In some embodiments, two or more recessed regions 42 can be positioned correspondingly to position of one sub-pixel of the display.

In the embodiment, the shapes of the recessed regions 42 are the same as the shapes of the lighting devices 20, such as rectangular shapes. However, the disclosure is not limited thereto. The shape and size of the recessed region 42 are approximate to that of the lighting device 20. For example, the length, width and depth of the recessed region 42 can be substantially equal to the length, width and depth of the lighting device 20. Alternatively, the length and width of the recessed region 42 can be slightly larger than the length and width of the lighting device 20. For example, the length of the recessed region 42 can be larger than the length of the lighting device 20 in excess of 0.2 µm to 0.5 µm, and the width of the recessed region 42 can be larger than the width of the lighting device 20 in excess of 0.2 µm to 0.5 µm. Also, the depth of the recessed region 42 can be larger than the depth of the lighting device 20. Alternatively, the depth of the recessed region 42 can be smaller than the depth of the micro-lighting device 20. Therefore, it is applicable when the lighting devices 20 are protruded from the recessed regions 42, as long as the lighting devices 20 can be received and set in the recessed regions 42. In one embodiment, the size of the lighting device 20 can be 1 µm to 200 µm in length, 1 µm to 200 µm in width and 1 µm to 50 µm in height. In other embodiment, the size of the lighting device 20 can be 4 µm to 60 µm in length, 4 µm to 60 µm in width and 4 µm to 30 µm in height. In one embodiment, the size of the recessed region 42 can be 1.2 µm to 300 µm in length, 1.2 µm to 300 µm in width, and 1 µm to 150 µm in depth. In other embodiment, the size of the recessed region 42 can be 4 µm to 60 µm in length, 4 µm to 60 µm in width, and 4 µm to 30 µm µm in depth.

Also, in one embodiment, the liquid 31 can be an organic solvent containing surfactant, or water containing surfactant. In one embodiment, the liquid 31 can be alkaline or acid etching liquids. The disclosure has no particular limitation to the composition of the liquid 31. Also, the shape and size of the recessed regions 42 should be adjusted and changed according to the shape and size of the lighting devices used in the practical application.

Figure 3B:
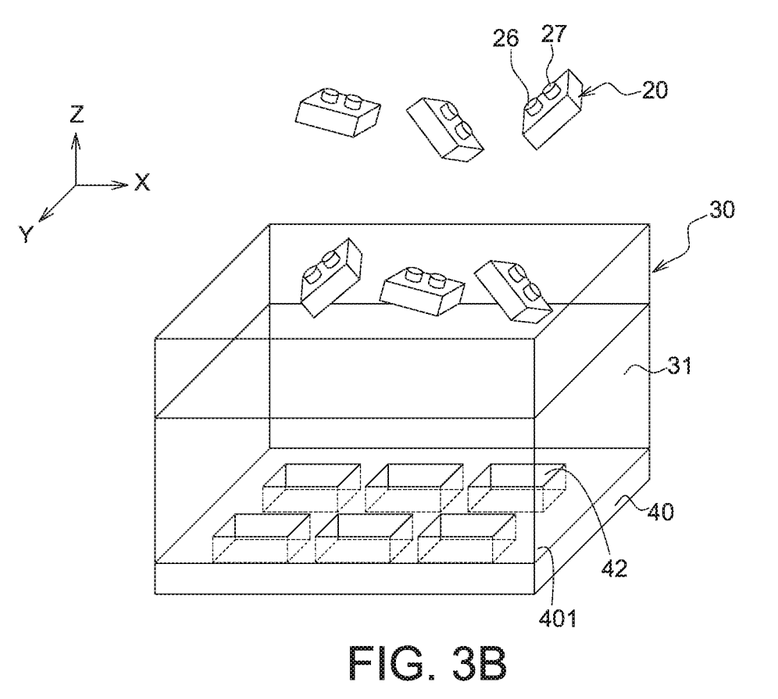
Figure 3C:
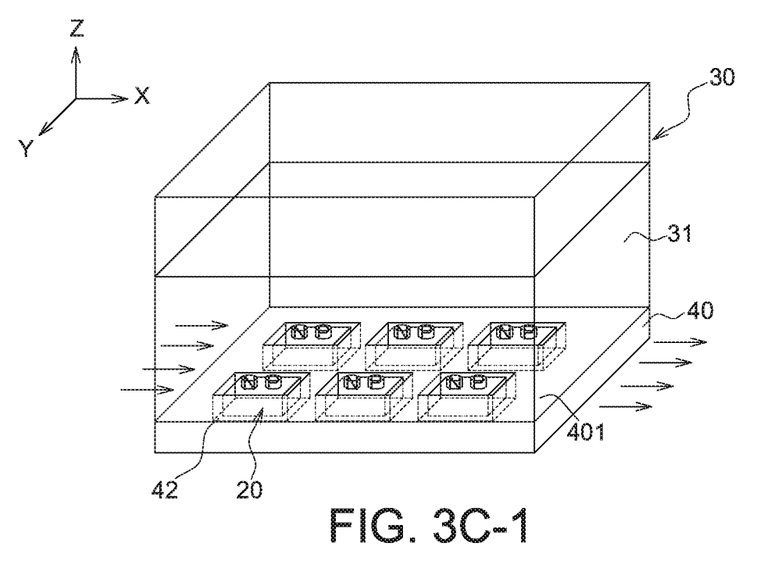
Figure 3C:
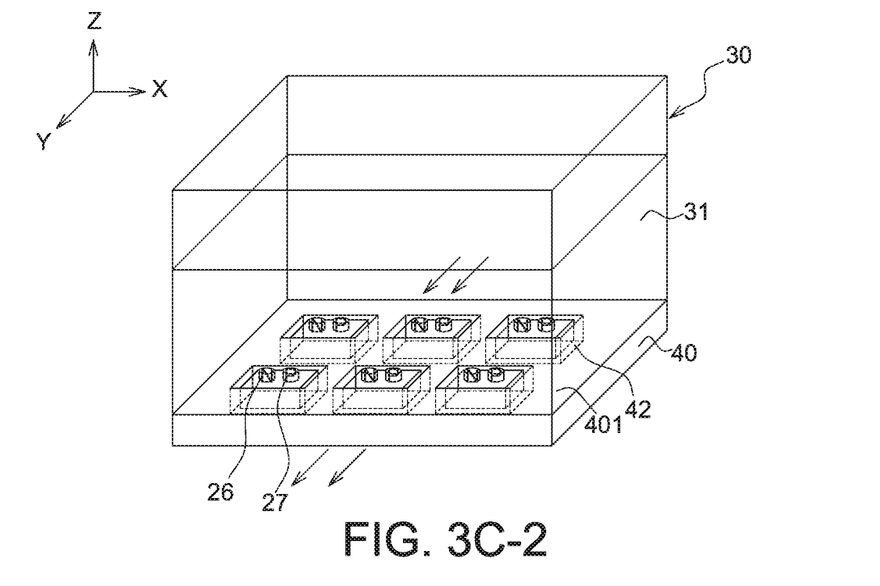

The carrying plate 40 is disposed in the tank 30 and immersed in the liquid 31, and then the lighting devices 20 are dropped in the liquid 31, as shown in FIG. 3B. Each of the lighting devices 20 includes at least two conductive pads, and at least one of the at least two conductive pads includes a magnetic material. Also, a magnetic field is applied for controlling the movement of the lighting devices 20 so as to set the lighting devices 20 within the recessed regions 42 of the carrying plate 40, as shown in FIG. 3C-1/FIG. 3C-2. Since a magnetic field exerts a force on the magnetic material, the direction of force on the magnetic material can be changed by varying the magnetic field direction of the magnetic field. In one embodiment, the force on the lighting devices 20 by an external magnetic field is (but not limited to) in a range of $1*10^{-2}$ (N) to $1*10^{-7}$ (N).

According to the embodiment, examples of the magnetic material include iron (Fe), cobalt (Co), nickel (Ni), alloys or compounds containing at least one of Fe, Co and Ni (a combination thereof). Examples of the alloys containing at least one of Fe, Co and Ni include (but not limited to) iron-silicon alloy, iron-nickel alloy and samarium-cobalt alloy. Also, the compounds containing at least one of Fe, Co and Ni can be ceramic oxides, and examples of the compounds containing at least one of Fe, Co and Ni include (but not limited to) one of ceramic oxides comprising $Fe_3O_4$, $NiFe_2O_4$, $MnFe_2O_4$, $(Zn, Mn)Fe_2O_4$, $BaO.6Fe_2O_3$, $PbO.6Fe_2O_3$, $CoO.Fe_2O_3$ and $CoFe_2O_4$.

In the first embodiment, the carrying plate 40 is disposed at a bottom surface 301 of the tank 30, and the magnetic field direction of an external magnetic field is in parallel with the carrying plate 40 (ex: in parallel with the upper surface 401 of the carrying plate 40). Also, in this embodiment, the magnetic field direction of an external magnetic field is also in parallel with the horizontal level and the bottom surface 301 of the tank 30. Moreover, it is applicable that only one of the two conductive pads (such as N-type conductive pad 26 and P-type conductive pad 27) of each lighting device 20 includes the magnetic material. Alternatively, it is applicable that two conductive pads of each lighting device 20 all include the magnetic material. Movement of the lighting devices 20 can be controlled through the appropriate magnetic field direction of the magnetic field provided.

In one embodiment, if only one of the two conductive pads such as N-type conductive pad 26 and P-type conductive pad 27 of each lighting device 20 includes the magnetic material, the magnetic field direction of the magnetic field is in parallel with an aligning direction of the at least two conductive pads of each of the lighting devices (such as X-direction), as shown in FIG. 3C-1. For example, merely the P-type conductive pads 27 or the N-type conductive pads 26 of all lighting devices 20 include the magnetic material, the magnetic field direction of the magnetic field in parallel with X-direction can be provided to control the movement of the lighting devices 20.

In another embodiment, both of two conductive pads (such as N-type conductive pad 26 and P-type conductive pad 27) of each lighting device 20 can include the magnetic material, and the magnetic field direction of the magnetic field (such as y-direction) is vertical to an aligning direction of two conductive pads of each of the lighting devices (such as X-direction) to control the movement of the lighting devices 20, as shown in FIG. 3C-2.

Figure 3D:
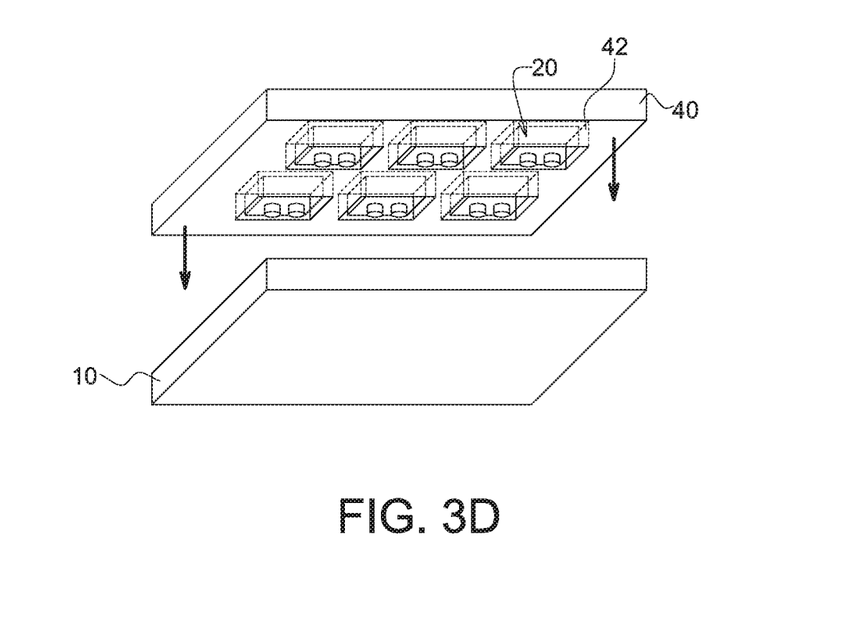

After the lighting devices 20 fell and set within the recessed regions 42 of the carrying plate 40, the carrying plate 40 with the lighting devices 20 is removed out of the liquid 31 for performing assembly of the lighting devices and an array substrate 10 with driving circuits and traces, as shown in FIG. 3D. For example, the N-type conductive pad 26 and P-type conductive pad 27 of each lighting device 20 (as shown in FIG. 1A and FIG. 1B) are electrical connected to the positive/negative pads 107 of the array substrate 10, thereby archiving the electrical connection between the lighting devices 20 in the recessed regions 42 of the carrying plate 40 and an array substrate 10. In some embodiments, each lighting device 20 in one recessed region 42 is positioned correspondingly to the position of one sub-pixel of the display; accordingly, each lighting device 20 is electrical connected to a sub-pixel position on the array substrate 10 after assembly. In some embodiments, two or more lighting device 20 in the recessed regions 42 can be positioned correspondingly to position of one sub-pixel of the display; accordingly, two or more lighting devices 20 are electrical connected to a sub-pixel position on the array substrate 10 after assembly.

Moreover, the recessed regions 42 can be coated with glue for adhering the lighting devices 20 in the recessed regions 42. Additionally, a step for vibrating the carrying plate 40 can be performed in the alignment method, before, during or after applying the magnetic field, for increasing the capture efficiency of the recessed regions 42 (i.e. the ratio of the lighting devices 20 captured by the recessed regions 42). Additionally, a heating step can be performed in the alignment method, before, during or after applying the magnetic field, for increasing the ratio of the lighting devices 20 captured by the recessed regions 42. A heating temperature can be ranged from 100° C. to 300° C., such as from 150° C. to 250° C.

Additionally, the alignment method of the embodiment may further include step of providing the liquid 31 with constant flow rate or variable flow rate, for assisting the action of the magnetic field on the lighting devices 20. For example, the migration velocity of the lighting devices 20 in the liquid 31 can be adjusted and controlled by varying the flow rate of the liquid 31, and the migration direction of the lighting devices 20 in the liquid 31 can be adjusted and controlled by varying the flowing direction of the liquid 31, thereby effectively setting the lighting devices 20 in the recessed regions 42. In one embodiment, the flowing direction of the liquid 31 can be (but not limited to) the same as the magnetic field direction of the magnetic field.

Furthermore, the alignment method of the embodiment may further include step of changing the magnetic field direction of the magnetic field. For example, an external magnetic field comprising the magnetic forces with different magnetic field directions, and those magnetic forces are applied at different time periods according to the practical conditions (ex: the conditions of the movements of the lighting devices 20 in the liquid 31 and/or relative positions between the lighting devices 20 and the recessed regions 42, etc.). For example, an external magnetic field has the first magnetic field direction and the second magnetic field direction (ex: respectively along the X-direction and the Y-direction), wherein the first magnetic field direction and the second magnetic field direction are applied at different time periods. Accordingly, the magnetic force with the first magnetic field direction is applied in the first time period while the magnetic force with the second magnetic field direction is applied in the second time period. The first and second time periods could be different time periods. In the embodiment, if some of the lighting devices 20 are not accurately fell into the recessed regions 42 after applying the magnetic force with the first magnetic field direction, the magnetic force with the second magnetic field direction different from the magnetic force with the first magnetic field direction can be applied to drag these lighting devices 20 into the recessed regions 42. According to the descriptions above, the movement of the lighting devices 20 (with the magnetic material) in the liquid 31 can be controlled by the magnetic field direction of the magnetic field as applied, and the migration speed of the lighting devices 20 in the liquid 31 can be controlled by the quantity of the magnetic force. Also, auxiliary steps (such as vibrating the carrying plate 40, making the liquid 31 flow, and heating as mentioned above) to speed up the migration and arrangement of the lighting devices 20 within the recessed regions 42. Those auxiliary steps can be performed alone or in a combination thereof. In the first embodiment, the carrying plate 40 is disposed at a bottom 301 of the tank 30, and the magnetic field direction of an external magnetic field is in parallel with the carrying plate 40 (ex: in parallel with the upper surface 401 of the carrying plate 40). Also, the magnetic field direction of the magnetic field can be determined based on the conditions that merely one or all of the conductive pads of each lighting device 20 include the magnetic material, as described above. According to the method of the embodiment, a large number of the lighting devices 20 can be arranged quickly, thereby efficiently accomplishing assembly of the lighting devices 20 to the array substrate, and enormously reducing the time of manufacturing a display equipped with the lighting devices 20.

Figure 4A:
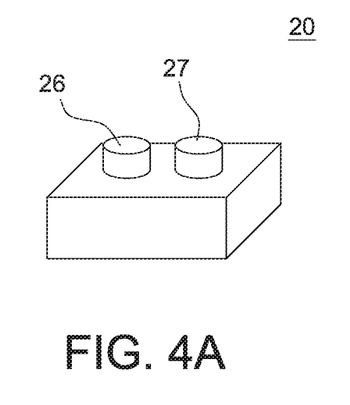
FIG. 4A, FIG. 4B and FIG. 4C show three different patterns of the electrodes of the lighting devices, including the lighting devices with normal flip-type electrodes, concentric loops flip-type electrodes and vertical-type electrodes, respectively.
Figure 4B:
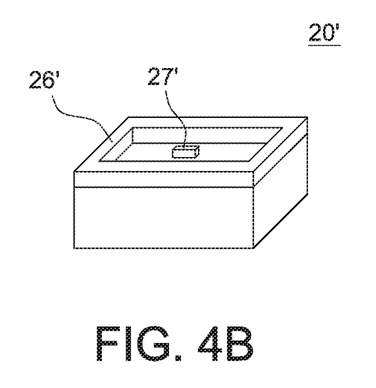
Figure 4C:
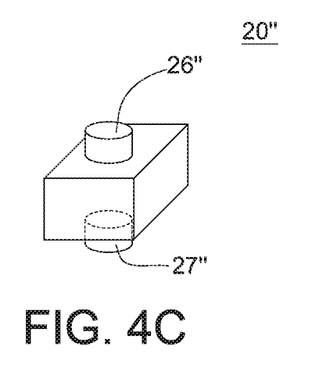

According to the patterns or alignments of the electrodes, the lighting devices can be divided into three types: the lighting devices with normal flip-type electrodes, concentric loops flip-type electrodes and vertical-type electrodes, as shown in FIG. 4A-FIG. 4C. Examples of the lighting devices 20, 20' and 20" includes the N-type conductive pads 26, 26', 26" and the P-type conductive pads 27, 27', 27". The disclosure has no particular limitations for the types of the lighting devices, and the types of the lighting devices as shown in FIG. 4A-FIG. 4C can be applicable in the embodiments of the disclosure (as illustrated by the method of FIG. 3A-FIG. 3D). The lighting devices with normal flip-type electrodes as shown in FIG. 4A are exemplified in the first embodiment, and the lighting devices with concentric loops flip-type electrodes are exemplified in the second embodiment.

Second Embodiment

In the first embodiment, the carrying plate 40 can be disposed at the bottom surface of the tank 30 and in parallel with the horizontal level (i.e. XY-plane). However, the disclosure is not limited thereto. The carrying plate 40 disposed at the bottom surface of the tank 30 can be tilted to the horizontal level with a tilted angle θ. In the embodiment, the tilted angle θ between the carrying plate 40 and the horizontal level is in a range of 0 to 90 degrees (i.e. 0≤θ<90; the tilted angle θ between the carrying plate 40 and the horizontal level is 0 degree in the first embodiment), or in a range of 0≤θ<45 degrees, or 0<θ<30 degrees, or 0<θ<15 degrees. Although a tank 30 with a slanted bottom having an angle θ (<45 degrees) tilted to the XY-plane is demonstrated in the second embodiment, the disclosure is not limited thereto.

Also, the identical and/or similar elements of the second and first embodiments are designated with the same and/or similar reference numerals, and the details of the configurations and procedures of the identical components/steps are not redundantly described herein.

Figure 5:
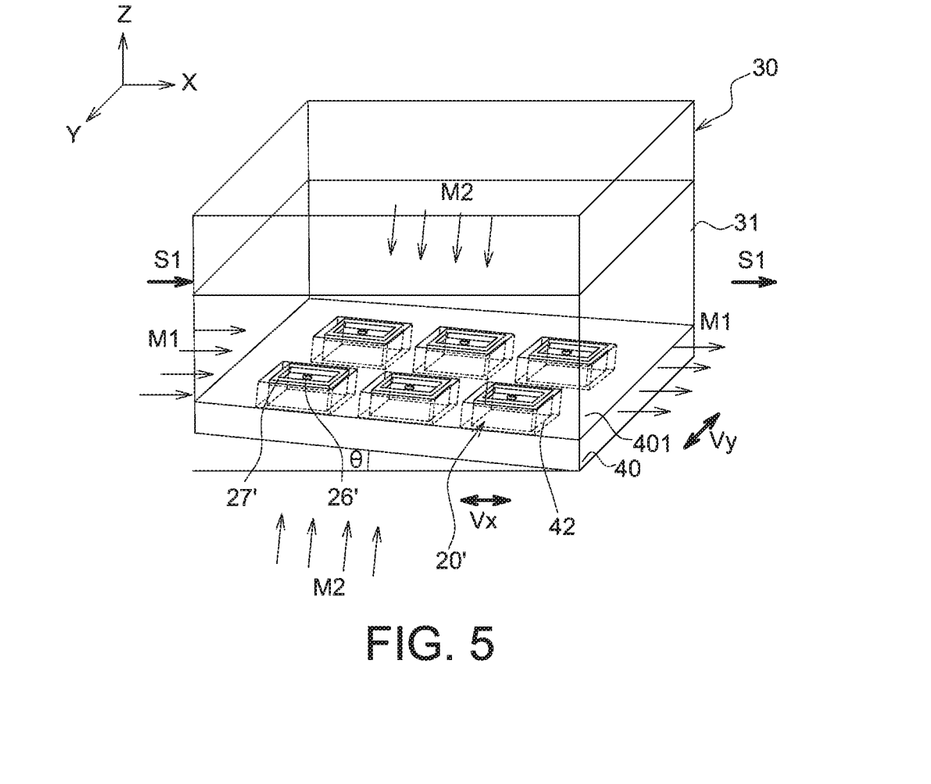
FIG. 5 simply depicts an arrangement of lighting devices of a display according to the second embodiment of the disclosure.

FIG. 5 simply depicts an arrangement of lighting devices of a display according to the second embodiment of the disclosure. Arrangement method of the second embodiment is similar to that of the first embodiment, which is not repeated herein. In this example, the carrying plate 40 is disposed at the bottom surface of the tank 30, and the carrying plate 40 can be tilted to the horizontal level with a tilted angle θ, wherein 0<θ<90. if the carrying plate 40 is a plate having an uniform thickness, the upper surface 401 of the carrying plate 40 is tilted to the horizontal level with the tilted angle θ, as shown in FIG. 5. In the second embodiment, the lighting devices 20' with concentric loops (i.e. concentric rectangular loops) flip-type electrodes are exemplified, wherein each of the lighting devices 20' has an N-type conductive pad 26' and a P-type conductive pad 27', and merely one or all of the conductive pads of each lighting device 20' include the magnetic material. Movement of the lighting devices 20' can be controlled through the appropriate magnetic field direction of an external magnetic field. As shown in FIG. 5, the magnetic field direction of the magnetic field such as the first magnetic field direction M1 is parallel with the horizontal level. However, the disclosure is not limited thereto, the magnetic field direction of the magnetic field can be parallel to the upper surface 401 of the carrying plate 40 for moving the lighting devices 20'. Also, another magnetic force can be further exerted on the lighting devices 20' for pushing the lighting devices 20' to move downwardly. As shown in FIG. 5, another magnetic force with a second magnetic field direction M2 is in parallel to a normal direction to the surface of the carrying plate 40 (i.e. the first magnetic field direction M1 in FIG. 5 is the direction parallel to the horizontal level, and the second magnetic field direction M2 in FIG. 5 is the direction parallel to the normal direction to the upper surface 401 of the carrying plate 40). However, the disclosure is not limited thereto, another magnetic field direction of the magnetic field can be parallel to the Z-direction (i.e. vertical to the horizontal level) for moving the lighting devices 20' downwardly. Additionally, those magnetic forces with the first magnetic field direction M1 and the second magnetic field direction M2 can be applied at different time periods. If the slanted carrying plate 40 of the second embodiment is adopted in the practical applications, the lighting devices 20 can be set within the recessed regions 42 without excessive magnetic force from the magnetic field, thereby decreasing the manufacturing cost.

Moreover, the auxiliary steps as described above can be selected and applied simultaneously. For example, the carrying plate 40 with an tilted angle (ex: θ) can be vibrated simultaneously when the movement of the lighting devices 20' in the liquid 31 is controlled by adjusting the magnetic field intensity and direction. The ratio of the lighting devices 20' captured by the recessed regions 42 can be increased by varying the tilted angles θ of the carrying plate 40. The vertical vector and the horizontal vector of the force of gravity on the lighting devices 20' are adjusted so as to increase the capture ratio of the lighting devices 20' by the recessed regions 42. Additionally, in the alignment method of the embodiment, the liquid 31 can be further driven to flow, and the ratio of the lighting devices 20' captured by the recessed regions 42 can be increased by controlling the flowing direction and/or flowing rate of the liquid 31.

As shown in FIG. 5, a step for vibrating the carrying plate 40 is performed before, during or after applying the magnetic field, such as the vibrations represented by the vibrating directions Vx and/or Vy, for increasing the ratio of the lighting devices 20' captured by the recessed regions 42. Also, the alignment method of the embodiment may further include step of providing the liquid 31 with constant flow rate or variable flow rate, such as a flowing liquid with the flowing direction S1, and the migration velocity of the lighting devices 20' in the liquid 31 can be adjusted and controlled by varying the flow rate of the liquid 31. Also, the migration direction of the lighting devices 20' in the liquid 31 can be adjusted and controlled by varying the flowing direction of the liquid 31, thereby effectively disposing the lighting devices 20' in the recessed regions 42. In one embodiment, the flowing direction of the liquid 31 can be (but not limited to) the same as the magnetic field direction of the magnetic field.

Moreover, in another embodiment, the carrying plate 40 can be designed as a structure with variable tilted angles θ, and the tilted condition of the carrying plate 40 is determined and changed in accordance with the arranging condition of the lighting devices 20' in the liquid 31. That is, when the movement of the lighting devices 20' in the liquid 31 are controlled by adjusting the magnetic field intensity and direction, the tilted carrying plate 40 is vibrated simultaneously, and the tilted angle of the carrying plate 40 changes for adjusting the vertical vector and the horizontal vector of the force of gravity on the lighting devices 20' based on the arranging condition of the lighting devices 20' in the liquid 31, thereby effectively increasing the ratio of the lighting devices 20' captured by the recessed regions 42.

After arrangement of the lighting devices 20' is completed, the carrying plate 40 (with the lighting devices 20' set thereon) is removed out of the liquid 31, and the lighting devices 20' are assembled to an array substrate 10 (ex: TFT array substrate), thereby achieving assembly and electrical connection between the lighting devices 20' and the array substrate 10 with driving circuits and traces.

Third Embodiment

Figure 6A:
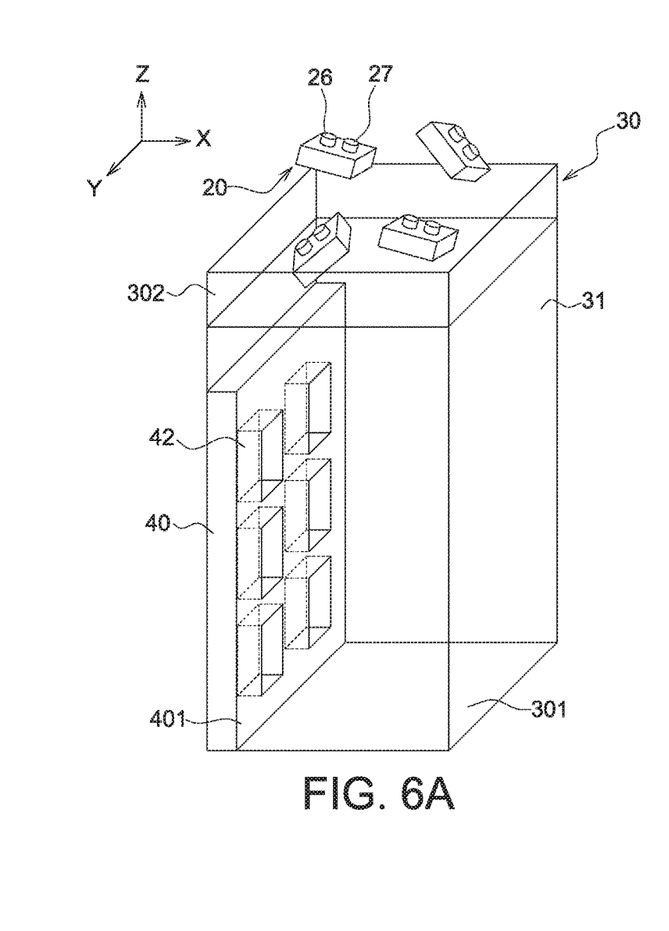

FIG. 6A-FIG. 6D illustrate an arrangement method of lighting devices of a display according to the third embodiment of the disclosure. The major difference between the first and third embodiments is the position of the carrying plate 40 in the tank 30. As shown in FIG. 6A, the carrying plate 40 is disposed at the sidewall 302 (vertical to the bottom 301 of the tank 30) of the tank 30, and the carrying plate 40 is vertical to the horizontal level. The upper surface of the carrying plate 40 is vertical to the horizontal level. Similarly, the carrying plate 40 of the third embodiment has several recessed regions 42, wherein the positions, shapes and sizes of the recessed regions 42 have been described above, and not redundantly repeated.

Figure 6B:
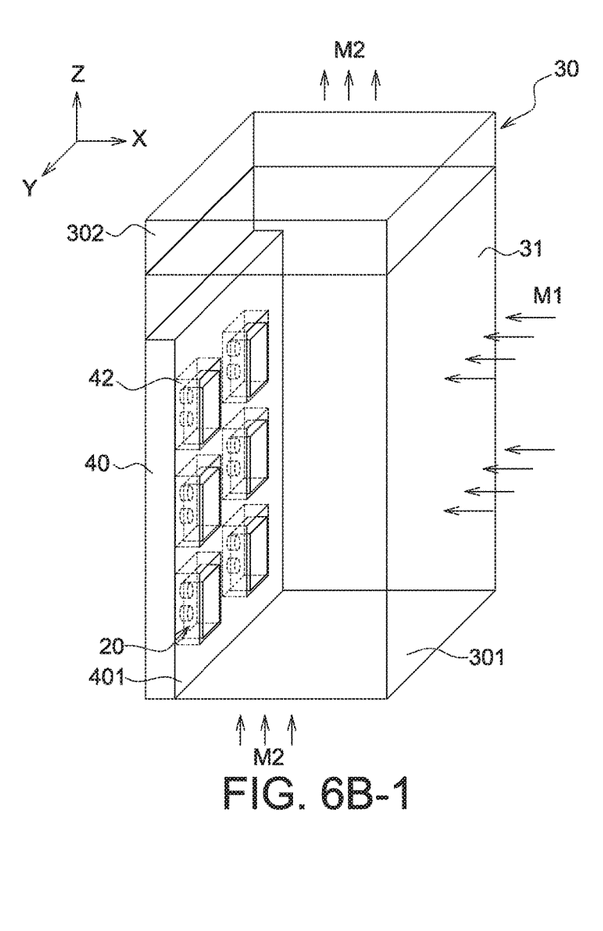
Figure 6B:
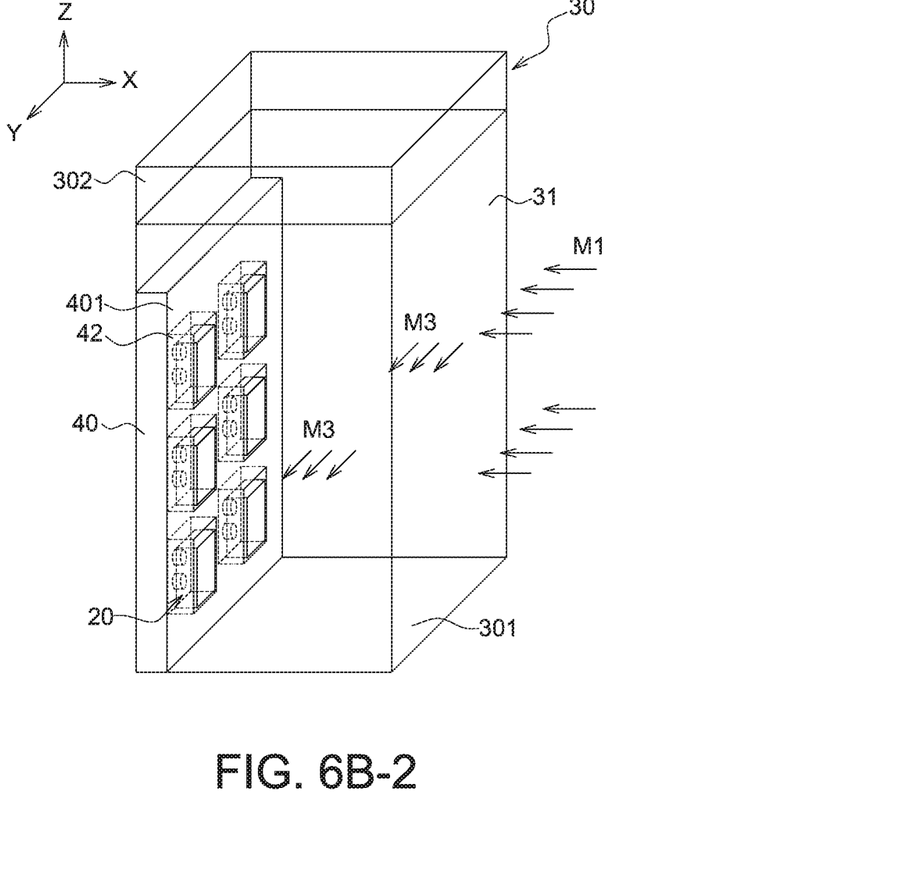

The lighting devices 20 are dropped in the liquid 31, and a magnetic field is applied for controlling the movement of the lighting devices 20 so as to set the lighting devices 20 within the recessed regions 42 of the carrying plate 40, as shown in FIG. 6B-1/FIG. 6B-2. In the third embodiment, the magnetic field direction of the magnetic field includes a magnetic field direction (ex: along the X-direction) vertical to the carrying plate 40, such as the first magnetic field direction M1, for driving the lighting devices 20 move towards to the carrying plate 40. The magnetic field direction of the magnetic field further includes a magnetic field direction (ex: along the Y-direction or Z-direction) parallel to the carrying plate 40, depending on the positions and alignments of the conductive pad(s) including the magnetic material. Similarly, it is applicable that only one or both of the two conductive pads (such as N-type conductive pad 26 and P-type conductive pad 27) of each lighting device 20 include the magnetic material. Movement of the lighting devices 20 can be controlled through the appropriate magnetic field direction (ex: along the Y-direction or Z-direction) of the magnetic field as provided, thereby setting the lighting devices 20 within the recessed regions 42.

In one embodiment, if only one of the two conductive pads such as N-type conductive pad 26 and P-type conductive pad 27 of each lighting device 20 includes the magnetic material, the magnetic field direction of the magnetic field includes the first magnetic field direction M1 as along the X-direction)(for moving the lighting devices 20 towards the carrying plate 40) and the second magnetic field direction M2 (such as along the Z-direction) parallel to an aligning direction of the conductive pads of each lighting device 20, as shown in FIG. 6B-1. In another embodiment, both of two conductive pads (such as N-type conductive pad 26 and P-type conductive pad 27) of each lighting device 20 include the magnetic material, the magnetic field direction of the magnetic field includes the first magnetic field direction M1 as along the X-direction)(for moving the lighting devices 20 towards the carrying plate 40) and the third magnetic field direction M3 (such as along the Y-direction) vertical to an aligning direction of the conductive pads of each lighting device 20, as shown in FIG. 6B-2.

It is, of course, that the auxiliary steps as described above can be selected and applied in the third embodiment. For example, when the movement of the lighting devices 20 in the liquid 31 is controlled by adjusting the magnetic field intensity and direction, the auxiliary steps such as vibrating the carrying plate 40, driving the liquid 31 to flow (controlling the flowing directions and/or rate of the liquid 31) or a heating step can be applied simultaneously for increasing the ratio of the lighting devices 20 captured by the recessed regions 42. More than one of those auxiliary steps can be adopted in the method, depending on the requirements of the practical application.

Figure 6C:
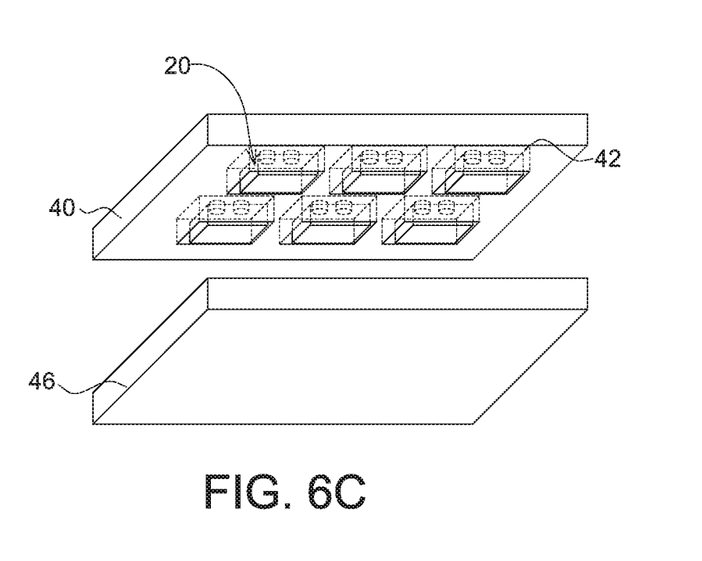

After the lighting devices 20 are set within the recessed regions 42, the carrying plate 40 is taken out of the liquid 31. As shown in FIG. 6B-1/6B-2, the N-type conductive pads 26 and the P-type conductive pads 27 of the lighting devices 20 face the bottoms of the recessed regions 42. Therefore, another carrying plate 46 can be used for transferring the lighting devices 20 on the carrying plate 40, as shown in FIG. 6C.

Figure 6D:
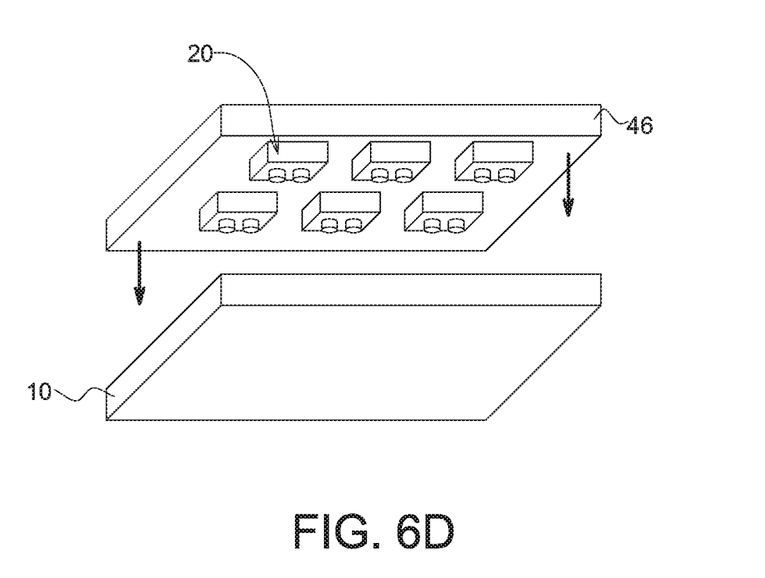

Thus, after arrangement of the lighting devices 20 is completed, followed by removing the carrying plate 40 out of the liquid 31 and transferring the lighting devices 20 to the carrying plate 46, the lighting devices 20 are assembled and electrical connected to an array substrate 10 (ex: TFT array substrate) with driving circuits and traces. As shown in FIG. 6D, all of the conductive pads (such as the N-type conductive pads 26 and the P-type conductive pads 27) of the lighting devices 20 face the array substrate 10 during assembly and connected to the corresponding positions of the array substrate 10.

Figure 7A:
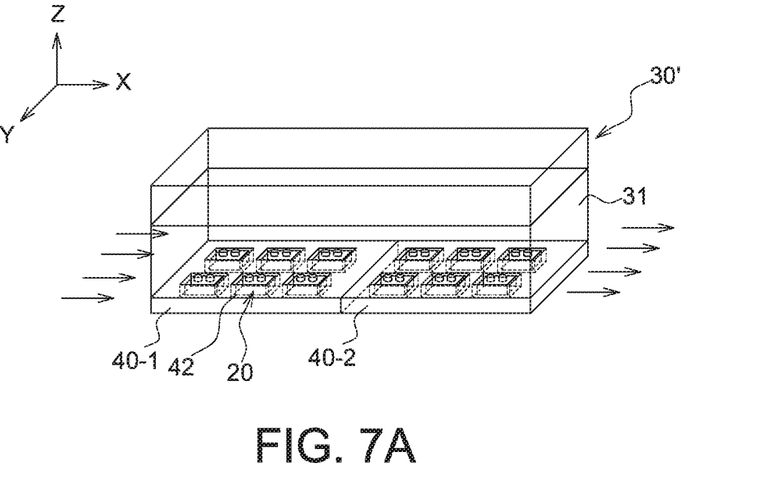
FIG. 7A depicts two carrying plates disposed in the bottom surface of the tank, wherein the lighting devices have been set within the recessed regions.
Figure 7B:
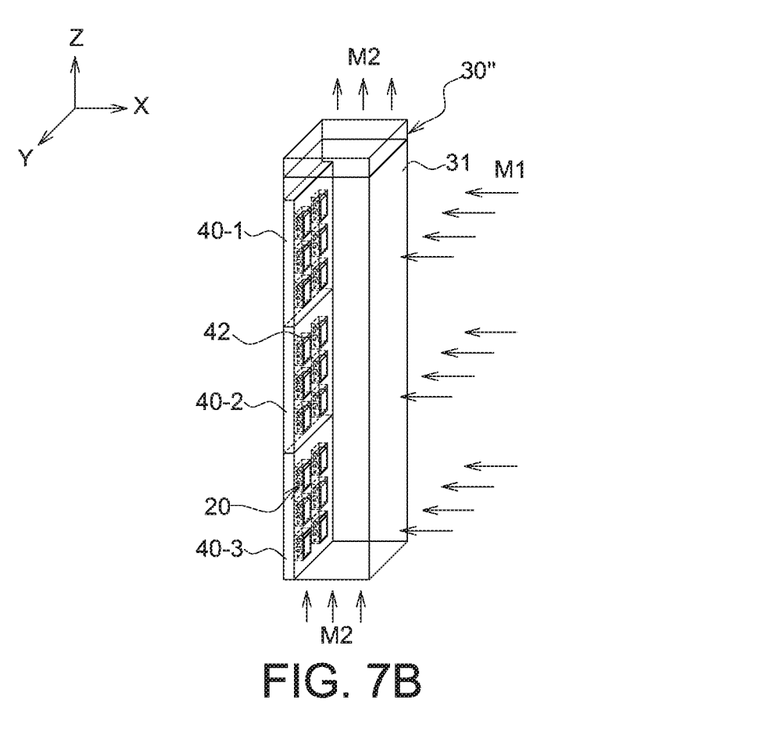
FIG. 7B depicts three carrying plates disposed in the bottom surface of the tank, wherein the lighting devices 20 have been set within the recessed regions.

Although the drawings of the embodiments depict that a single carrying plate 40 is disposed in the tank 30, the disclosure is not limited thereto, two or more carrying plates 40 can be disposed in the tank 30 followed by proceeding the methods as described above. Please refer to FIG. 7A, which depicts two carrying plates 40-1 and 40-2 disposed in the liquid 31 and the lighting devices 20 set within the recessed regions 42; please also refer to the first embodiment for the details of the arrangement method of the lighting devices. FIG. 7B depicts three carrying plates 40-1, 40-2 and 40-3 disposed in the liquid 31, wherein the lighting devices 20 are set within the recessed regions 42; please also refer to the third embodiment for the details of the arrangement method of the lighting devices.

According to the aforementioned descriptions, the arrangement methods of the lighting devices of a display according to the embodiments are disclosed by providing the lighting devices with special designs, wherein each of the lighting devices 20/20' includes at least two conductive pads, and at least one of the at least two conductive pads includes a magnetic material. Also, the movement (ex: migrating direction) of the lighting devices 20/20' can be controlled through the appropriate magnetic field direction of the magnetic field as provided, so that a large number of the lighting devices 20/20' can be arranged quickly for efficiently accomplishing assembly of the lighting devices 20/20' to An array substrate. Moreover, the auxiliary steps as described above can be selected and applied simultaneously in the embodiments; for example, vibrating the carrying plate 40, providing a flowing liquid 31 (controlling the flowing directions and/or rate of the liquid 31) or a heating step can be applied simultaneously for increasing the ratio of the lighting devices 20/20' captured by the recessed regions 42. When the method of the embodiment is applied in the application of a self-emission type of display, the lighting devices can be arranged in a short period, and subsequently disposed and assembled to the corresponding sub-pixels at a time. Compared to the conventional method for disposing the lighting devices (i.e. pick-and-place, which is time-consuming and not suitable for massive production), the method of the embodiment significantly shortens the time for manufacturing the display, which has great economic value and is suitable for mass production.

Other embodiments with different configurations of known elements can be applicable, and the arrangement depends on the actual needs of the practical applications. It is, of course, noted that the configurations of figures are depicted only for demonstration, not for limitation. It is known by people skilled in the art that the related elements of the array substrate and the lighting devices, the electrodes of the lighting device, shapes or positional relationship of the recessed regions 42 and the procedure details could be adjusted according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of display with lighting devices, comprising:
    providing a tank containing a liquid;
    disposing a carrying plate with a plurality of recessed regions in the tank, and the carrying plate being immersed in the liquid;
    dropping a plurality of lighting devices into the liquid, wherein each of the lighting devices includes at least two conductive pads, and at least one of the at least two conductive pads includes a magnetic material;
    applying a magnetic field for the lighting devices and disposing the lighting device within the plurality of recessed regions of the carrying plate; and
    removing the carrying plate with the lighting devices out of the tank, and assembling the lighting devices to an array substrate.

2. The manufacturing method according to claim 1, wherein the carrying plate is disposed at a bottom surface of the tank, wherein a magnetic field direction of the magnetic field is in parallel with an upper surface of the carrying plate.

3. The manufacturing method according to claim 2, wherein only one of the at least two conductive pads of the each of lighting devices includes the magnetic material, and the magnetic field direction of the magnetic field is in parallel with an aligning direction of the at least two conductive pads.

4. The manufacturing method according to claim 2, wherein the at least two conductive pads of the each of the lighting devices include the magnetic material, and the magnetic field direction of the magnetic field is vertical to an aligning direction of the at least two conductive pads.

5. The manufacturing method according to claim 1, wherein the carrying plate is disposed at a bottom surface of the tank, and a tilted angle θ between an upper surface of the carrying plate and the horizontal level is in a range of 0 to 90 degrees.

6. The manufacturing method according to claim 5, wherein the magnetic field has a magnetic field direction parallel to an upper surface of the carrying plate.

7. The manufacturing method according to claim 5, wherein the magnetic field has a magnetic field direction parallel to the horizontal level.

8. The manufacturing method according to claim 7, wherein the magnetic field has another magnetic field direction vertical to an upper surface of the carrying plate.

9. The manufacturing method according to claim 1, wherein the carrying plate is disposed at a sidewall of the tank and vertical to a horizontal level, and the magnetic field has a magnetic field direction perpendicular to an upper surface of the carrying plate.

10. The manufacturing method according to claim 9, wherein only one of the at least two conductive pads of the each of the lighting devices includes the magnetic material, and the magnetic field further has another magnetic field direction in parallel with an aligning direction of the at least two conductive pads of the each of the lighting devices.

11. The manufacturing method according to claim 9, wherein the at least two conductive pads of the each of the lighting devices include the magnetic material, and the magnetic field further has an another magnetic field direction in parallel with the carrying plate but perpendicular to an aligning direction of the at least two conductive pads of the each of the lighting devices.

12. The manufacturing method according to claim 1, wherein the magnetic field has a first magnetic field direction and a second magnetic field direction, wherein the first magnetic field direction and the second magnetic field direction are applied at different time periods.

13. A display with lighting devices, comprising:
    an array substrate, comprising a plurality of sub-pixel regions; and
    a plurality of lighting devices disposed on the array substrate,
    wherein at least one of the plurality of lighting devices is disposed correspondingly to each of the plurality of sub-pixel regions, and the at least one of the plurality of lighting devices includes two conductive pads, and one of the two conductive pads includes magnetic material.

* * * * *